US010116288B2

(12) United States Patent
Rao et al.

(10) Patent No.: US 10,116,288 B2
(45) Date of Patent: Oct. 30, 2018

(54) REDUCED OVERHEAD ON DIGITAL SIGNAL PROCESSING FOR MOTOR DRIVE APPLICATIONS

(71) Applicant: HAMILTON SUNDSTRAND CORPORATION, Charlott, NC (US)

(72) Inventors: Sesh Mohan Rao, Bangalore (IN); Shobhit Agrawal, Bangalore (IN); Priya Kakarla Naga Lakshmi, Bangalore (IN)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 15/482,384

(22) Filed: Apr. 7, 2017

(65) Prior Publication Data

US 2018/0226955 A1    Aug. 9, 2018

(30) Foreign Application Priority Data

Feb. 7, 2017  (IN) .............................. 201711004438

(51) Int. Cl.
| | |
|---|---|
| G05D 23/19 | (2006.01) |
| G07F 7/00 | (2006.01) |
| G09G 5/08 | (2006.01) |
| G06F 9/44 | (2018.01) |
| H02M 3/04 | (2006.01) |
| H02M 5/02 | (2006.01) |
| H02M 5/257 | (2006.01) |
| H03K 3/033 | (2006.01) |
| H03K 5/156 | (2006.01) |
| H03M 1/12 | (2006.01) |

(52) U.S. Cl.
CPC ........... *H03K 3/033* (2013.01); *H03K 5/1565* (2013.01); *H03M 1/124* (2013.01)

(58) Field of Classification Search
CPC ..... H03K 3/033; H03K 5/1565; H03M 1/124; B26D 5/20; B26D 5/32
USPC .................................................. 327/100–364
See application file for complete search history.

(56) References Cited

U.S. PATENT DOCUMENTS

| | | | | |
|---|---|---|---|---|
| 4,624,578 | A | * 11/1986 | Green | ................. G07F 17/0014 340/309.8 |
| 4,816,996 | A | 3/1989 | Hill et al. | |
| 4,882,764 | A | * 11/1989 | Reynolds | ................. B26D 5/32 250/559.44 |

(Continued)

FOREIGN PATENT DOCUMENTS

| | | |
|---|---|---|
| EP | 1583242 A1 | 10/2005 |
| JP | S5827428 A | 2/1983 |

OTHER PUBLICATIONS

Search Report dated Jul. 16, 2018 in U380865EP, EP Application No. 18155143, 7 pages.

(Continued)

*Primary Examiner* — Brandon S Cole
(74) *Attorney, Agent, or Firm* — Cantor Colburn LLP

(57) ABSTRACT

In accordance with one or more embodiments, a monostable multivibrator that is communicatively coupled to a host device and an external analog-to-digital converter is provided. The monostable multivibrator receives a chip select signal from the host device. The monostable multivibrator also generates, in response to the chip select signal, a conversion start signal to the external analog-to-digital converter.

7 Claims, 4 Drawing Sheets

(56) References Cited

U.S. PATENT DOCUMENTS

| | | | |
|---|---|---|---|
| 4,937,575 A | | 6/1990 | Kummar |
| 5,166,685 A | | 11/1992 | Campbell, Jr. et al. |
| 5,168,276 A | | 12/1992 | Huston et al. |
| 5,459,846 A | * | 10/1995 | Hyatt ................ B60R 16/0373 711/167 |
| 5,633,673 A | * | 5/1997 | Sato ...................... B41J 2/471 347/131 |
| 5,703,583 A | | 12/1997 | Ansari et al. |
| 7,209,066 B1 | | 4/2007 | Trumbo |
| 7,533,106 B2 | | 5/2009 | Magdeburger |
| 8,797,067 B1 | * | 8/2014 | Tan ..................... H04L 25/028 327/47 |
| 8,994,565 B2 | | 3/2015 | Forte et al. |
| 9,357,551 B2 | | 5/2016 | Gutman |
| 2006/0136626 A1 | | 6/2006 | Avritch et al. |
| 2007/0152968 A1 | * | 7/2007 | Cheng ................ G06F 3/03543 345/163 |
| 2007/0291823 A1 | * | 12/2007 | Ben-Bassat ........ H04B 1/70712 375/141 |
| 2017/0201931 A1 | * | 7/2017 | Swanzey ............... H04W 48/10 |

OTHER PUBLICATIONS

Texas Instruments, "Low-Power, 16-Bit, Sampling CMOS Analog-to-Digital Converter", 1992, 57 pages.

\* cited by examiner

REDUCED OVERHEAD ON DIGITAL SIGNAL PROCESSING FOR MOTOR DRIVE APPLICATIONS

BACKGROUND

This application claims priority to India Patent Application No. 201711004438, filed Feb. 7, 2017, and all the benefits accruing therefrom under 35 U.S.C. § 119, the contents of which in its entirety are herein incorporated by reference.

Simultaneous Sampling analog-to-digital convertors (ADC), which provide the ability to sample data on two or more analog inputs simultaneously, are utilized by motor drive applications, as there is a necessity to sample multiple signals at the same time. Examples of sample data include resolver excitation and sine, cosine feedback signals, which are to be sampled simultaneously. Internal ADCs in some microcontrollers and/or digital signal processors (DSP) support simultaneous sampling up to two channels. However, there are several circuits in motor drives that require more than two signals to be simultaneous sampled. Further, internal ADCs do not support high precision measurements due to limited resolution and performance. In addition, while there are external simultaneous sampling ADCs that interface with field-programmable gate array, these external simultaneous sampling ADCs provide extreme overhead for DSPs. This results in the need for high precision external ADCs.

BRIEF DESCRIPTION

In accordance with one or more embodiments, a monostable multivibrator communicatively coupled to a host device and an external analog-to-digital converter is provided. The monostable multivibrator is configured to receive a chip select signal from the host device. The monostable multivibrator is also configured to generate, in response to the chip select signal, a conversion start signal to the external analog-to-digital converter.

In accordance with one or more embodiments, the monostable multivibrator can utilize when the chip select signal goes low as a trigger to generate the conversion start signal.

In accordance with one or more embodiments, the monostable multivibrator can be configured to repeat in each cycle as the chip select signal goes low the conversion start signal.

In accordance with one or more embodiments, the conversion start signal can comprise a monostable pulse provided by the monostable multivibrator to the external analog-to-digital converter.

In accordance with one or more embodiments, a resistor-capacitor circuit of the monostable multivibrator can be utilized to control a pulse width of the monostable pulse.

In accordance with one or more embodiments, the host device can be configured to enable a delay between the chip select signal and an application of a clock to allow a conversion.

In accordance with one or more embodiments, the host device can be configured to utilize a serial peripheral interface enable signal to control an application of a serial clock.

In accordance with one or more embodiments, a busy signal from the external analog-to-digital converter can indicate a completion of a conversion.

In accordance with one or more embodiments, the host device can be a digital signal processor.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Embodiments herein relate to operating and controlling high precision external ADCs while reducing/avoiding software overhead during sampling in motor drive applications. Accordingly, an external ADC can be interfaced to a host device (e.g., a microcontroller, DSP, or field-programmable gate array (FPGA)) through serial peripheral interface (SPI) or parallel interface for reading digital data that is further processed by the host device. Further, the simultaneously sampling by the external ADC requires a conversion start signal input from the host device to initiate the conversion (e.g., the sampling). For instance, when the host device is a DSP (or the like), providing a dedicated signal along with the SPI interface to start the conversion results in software overhead for the DSP, as central processing unit (CPU) interventions are necessary for communication with the external ADC (which negatively affects task scheduling in a scheduler of the DSP). To reduce/avoid this software overhead, a monostable multivibrator is inserted between the DSP and the external ADC, so that the conversion start signal can be generated for the external ADC by the monostable multivibrator in hardware.

Figure 1:
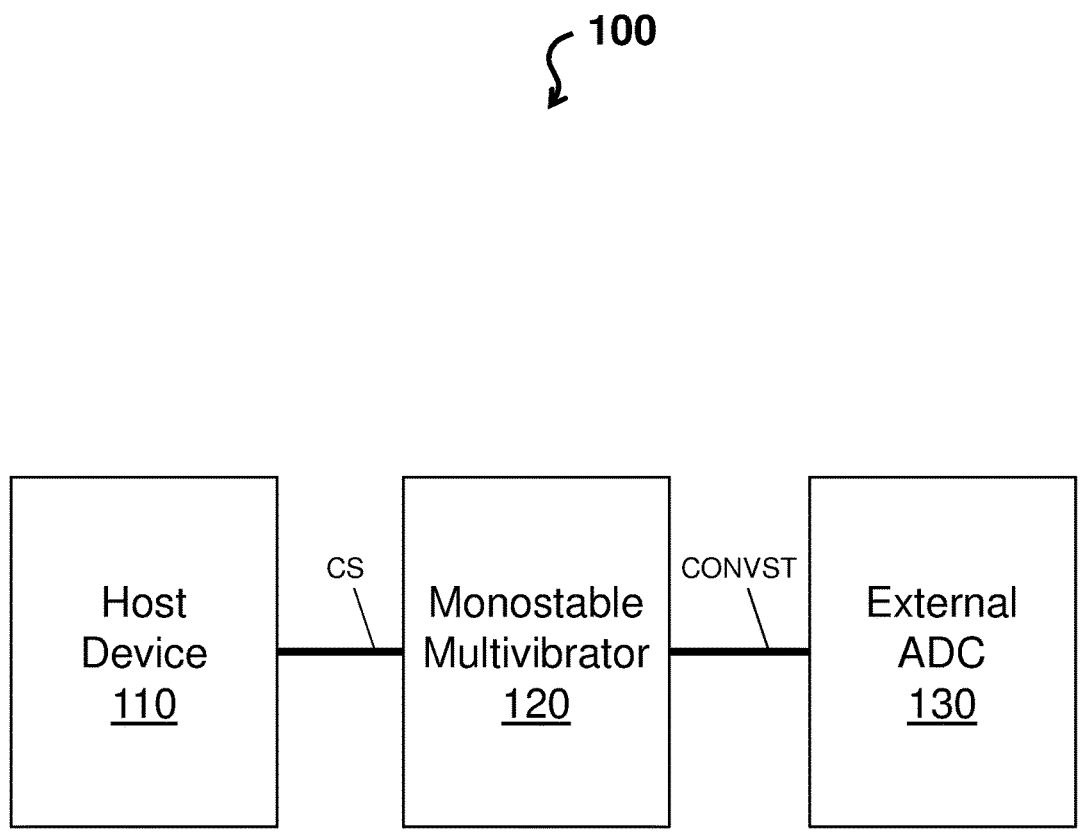
FIG. 1 depicts a system including a signal flow of a conversion start signal utilizing a chip select signal in accordance with one or more embodiments.

Turning now to FIG. 1, a system 100 including a signal flow of a conversion start signal CONVST utilizing a chip select signal CS is depicted in accordance with one or more embodiments. The system 100 comprises a host device 110 (e.g., a DSP or the like), monostable multivibrator 120, and external ADC 130. The monostable multivibrator 120 is communicatively coupled to/between the host device 110 and the external analog-to-digital converter 120.

In non-limiting example operation, the conversion start signal CONVST can be generated for the external ADC 130 by the monostable multivibrator 120 in hardware, without causing any overhead in software. That is, as part of a serial peripheral interface (SPI) or parallel interface, the chip select signal CS (e.g., an active low chip select signal) is generated by the host device 110.

Figure 2:
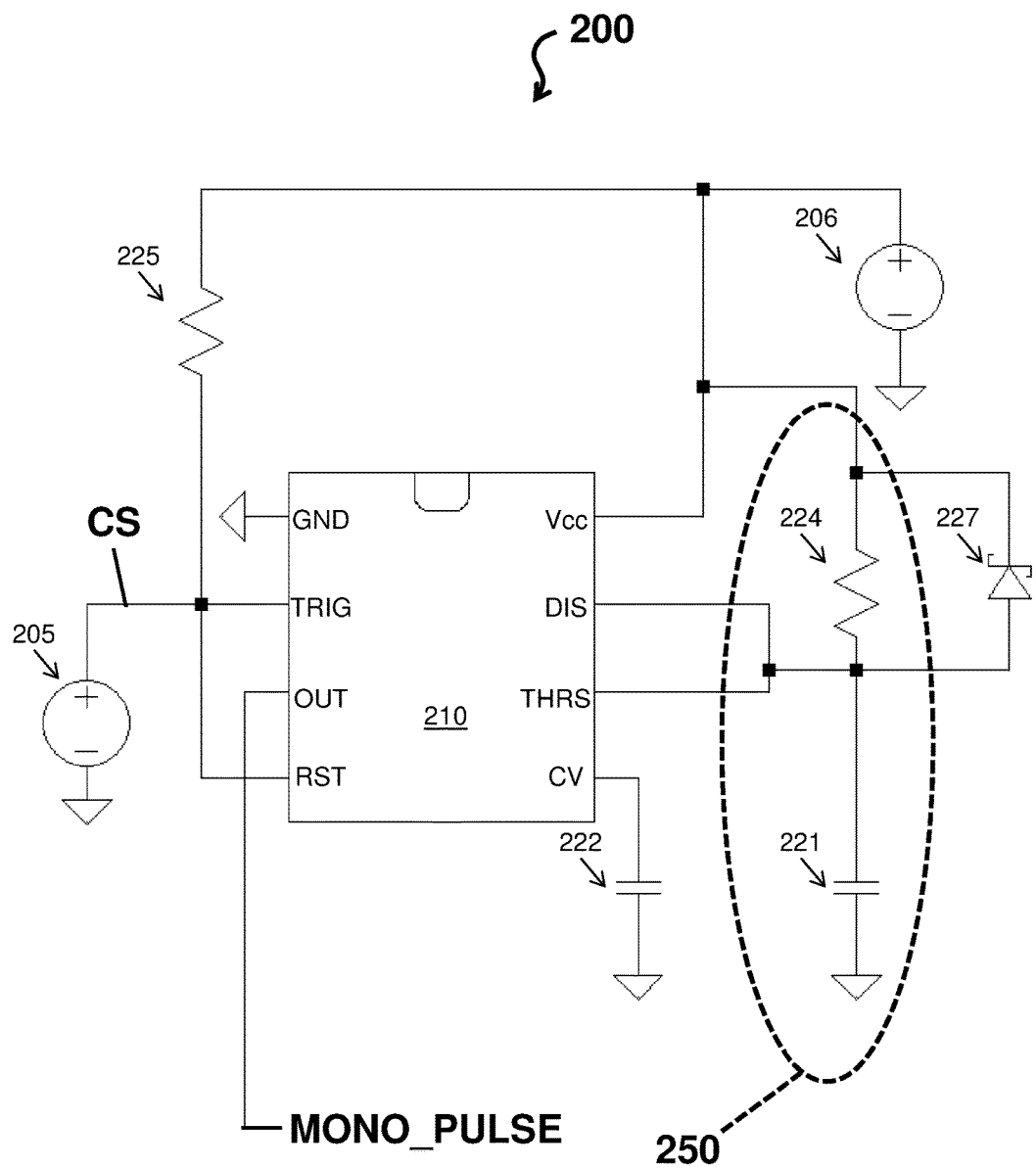
FIG. 2 depicts a circuit diagram of a monostable multivibrator in accordance with one or more embodiments.

In accordance with one or more embodiments, at the start of the SPI or parallel communication, the chip select signal CS goes low, which is used by the monostable multivibrator 120 as a trigger to provide a monostable pulse (e.g., conversion start signal CONVST), which starts the conversion. Turning now to FIG. 2, a circuit diagram 200 of the monostable multivibrator 120 is depicted in accordance with one or more embodiments. The circuit diagram 200 comprises a first voltage 205, a second voltage 206, a chip 210, a first capacitor 221, a second capacitor 222, a first resistor 224, a second resistor 225, and a diode 227. The chip 210 can comprise eight pins, including a ground GND, a trigger pin TRIG, an output pin OUT, a reset pin RST, a power pin Vcc, a pin DIS, a pin THRS, and a pin CV.

The chip select signal CS can be received by the chip 210 on the trigger pin TRIG from the first voltage 205 (e.g., originating from the host device 110). When the chip select signal CS goes low, the chip 210 in turn provides a monostable pulse (e.g., MONO_PULSE) via the output pin OUT, which starts the conversion. Note that the pulse width can be controlled by the resistor-capacitor circuit 250.

Figure 3:
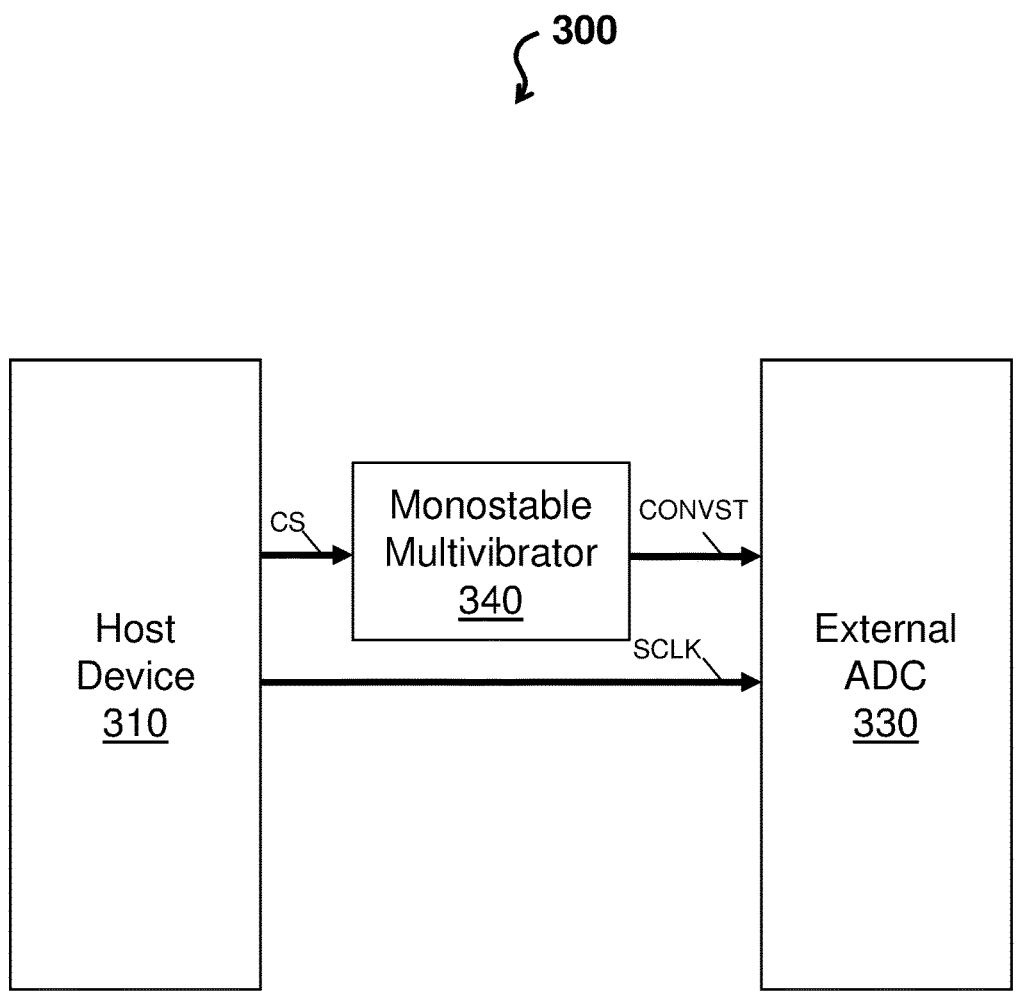
FIG. 3 depicts an example interface between a host device and external ADC in accordance with one or more embodiments.

FIG. 3 depicts another example interface 300 between a host device 310 and an external ADC 330 in accordance with one or more embodiments. As shown in FIG. 3, a monostable multivibrator 340 is inserted between the host device 310 and the external ADC 330. In operation, the conversion repeats in each cycle as the chip select signal CS goes low. The host device 310 can also allow a delay between the chip select signal CS going low to an application of a clock to be controllable through programmable registers as a part of the standard SPI or parallel interface. This delay can be controlled to allow the conversion to complete, before an application of the clock. Further, this option uses the concept that standard SPI control registers in the host device 310 allows the configuration of the delay between the falling edge of the chip select and application of the serial clock (SCLK).

Figure 4:
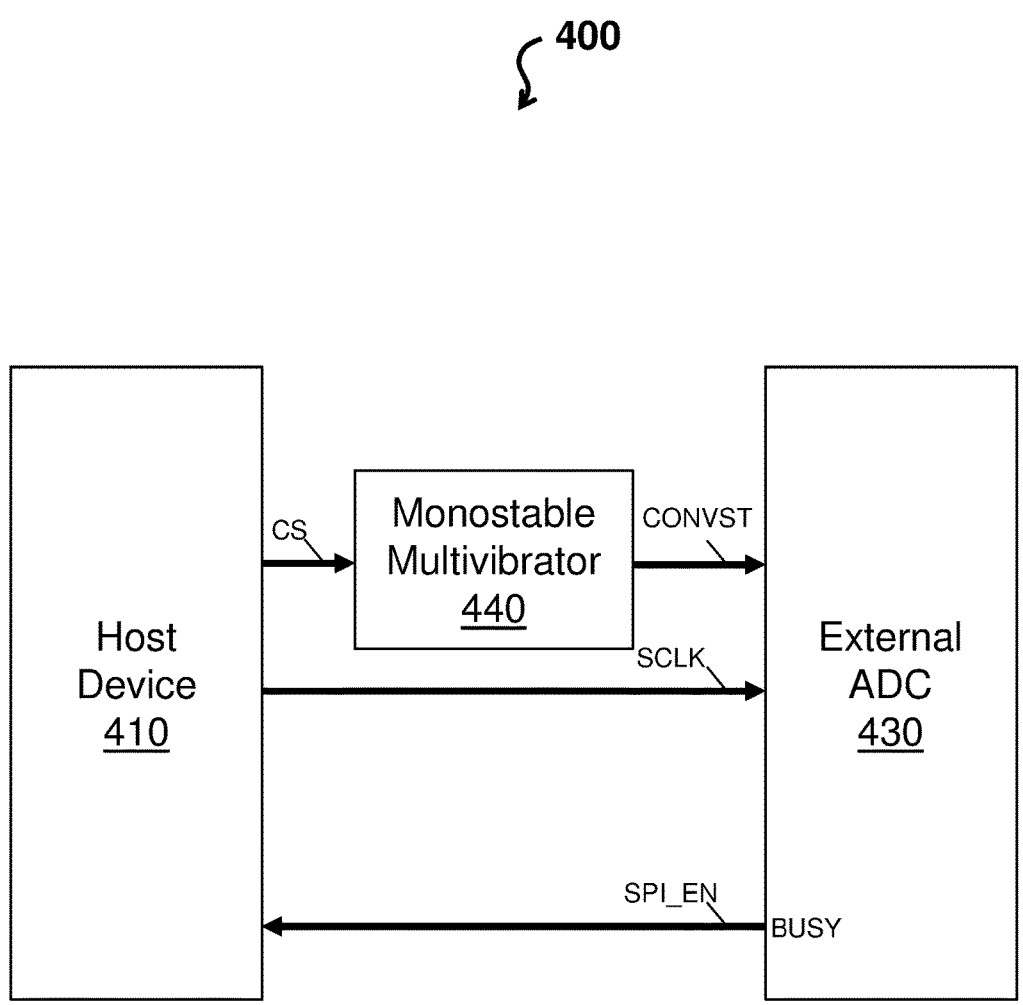
FIG. 4 depicts another example interface between a host device and external ADC in accordance with one or more embodiments.

FIG. 4 depicts another example interface 400 between a host device 410 and an external ADC 430 in accordance with one or more embodiments. As shown in FIG. 4, a monostable multivibrator 440 is inserted between the host device 410 and the external ADC 430. In operation, the host device 410 can also provide SPI enable signal, which can be controlled by the BUSY signal from the external ADC 430. In turn, a serial clock can be started by the host device 410 when the SPI enable signal is asserted. Further, this option uses the concept that some host processors support SPI Enable signal, which controls the application of SCLK. The BUSY signal from the external ADC 430 indicates the completion of conversion by changing state to low, this can be tied to the SPI_EN input of the host device 410 to indicate to the host device 410 that the conversion is complete and the external ADC 430 is ready to transact the data.

Either of these mechanisms of FIGS. 3 and 4 can ensure that a converted result is available before the SPI transaction happens.

Technical effects and benefits of the system 100 include avoiding providing a separate discrete signal for enabling a start of a conversion by software, as the conversion start signal CONVST is tied with the function of the chip select signal CS (due to the addition of the monostable multivibrator 120) and conversion happens as soon as the chip select signal CS is activated (by the host device 110). Further, since there is no overhead on the software due to CPU intervention, the SPI transactions can be controlled through direct memory access (DMA), which allows a precise external simultaneous sampling ADC (e.g., the external ADC 130) to be interfaced to a DSP (e.g., the host device 110), so that multiple channel sampling can be done simultaneously and accurately.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A monostable multivibrator communicatively coupled to a host device and an external analog-to-digital converter, the monostable multivibrator configured to:
   receive a chip select signal from the host device, the chip select signal going low to trigger the monostable multivibrator to provide the monostable pulse; and
   generate, in response to the chip select signal, a conversion start signal to the external analog-to-digital converter, the conversion start signal comprising the monostable pulse provided by the monostable multivibrator to the external analog-to-digital converter; and
   control a pulse width of the monostable pulse by a resistor-capacitor circuit of the monostable multivibrator.

2. The monostable multivibrator of claim 1, wherein the monostable multivibrator utilizes when the chip select signal goes low as a trigger to generate the conversion start signal.

3. The monostable multivibrator of claim 2, wherein the monostable multivibrator is configured to repeat in each cycle as the chip select signal goes low the conversion start signal.

4. The monostable multivibrator of claim 1, wherein the host device is configured to enable a delay between the chip select signal and an application of a clock to allow a conversion.

5. The monostable multivibrator of claim 1, wherein the host device is configured to utilize a serial peripheral interface enable signal to control an application of a serial clock.

6. The monostable multivibrator of claim 1, wherein a busy signal from the external analog-to-digital converter indicates a completion of a conversion.

7. The monostable multivibrator of claim 1, wherein the host device is a digital signal processor.

\* \* \* \* \*